(12) United States Patent
Goto et al.

(10) Patent No.: US 8,309,857 B2
(45) Date of Patent: Nov. 13, 2012

(54) PATTERN ELECTRODE MANUFACTURING METHOD AND PATTERN ELECTRODE

(75) Inventors: Masaki Goto, Tokyo (JP); Akihiko Takeda, Kanagawa (JP); Kazuaki Nakamura, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 321 days.

(21) Appl. No.: 12/875,184

(22) Filed: Sep. 3, 2010

(65) Prior Publication Data

US 2011/0061908 A1  Mar. 17, 2011

(30) Foreign Application Priority Data

Sep. 14, 2009  (JP) .................................. 2009211428

(51) Int. Cl.
*H05K 1/09* (2006.01)

(52) U.S. Cl. ............ 174/257; 438/106; 29/877; 29/878; 428/553; 427/58; 427/383.1; 216/56

(58) Field of Classification Search .................. 174/257; 438/106; 29/877, 878; 428/553; 427/58; 427/383.1; 216/56
See application file for complete search history.

(56) References Cited

U.S. PATENT DOCUMENTS

| | | | | |
|---|---|---|---|---|
| 6,074,893 A | * | 6/2000 | Nakata et al. ................. | 438/106 |
| 6,132,927 A | * | 10/2000 | Daems et al. ............. | 430/270.1 |
| 2002/0063677 A1 | * | 5/2002 | Drzaic ........................... | 345/107 |
| 2002/0074314 A1 | * | 6/2002 | Bohn et al. ...................... | 216/56 |
| 2005/0196707 A1 | | 9/2005 | Cok | |
| 2005/0244977 A1 | * | 11/2005 | Drachev et al. ................. | 436/86 |
| 2005/0258522 A1 | * | 11/2005 | En et al. ......................... | 257/670 |
| 2006/0127818 A1 | * | 6/2006 | Cho et al. ...................... | 430/321 |
| 2007/0074316 A1 | | 3/2007 | Alden et al. | |
| 2008/0143906 A1 | | 6/2008 | Allemand et al. | |
| 2009/0087570 A1 | * | 4/2009 | Kawata et al. ............. | 427/383.1 |
| 2009/0269606 A1 | * | 10/2009 | Matsumoto ................... | 428/553 |
| 2010/0163858 A1 | * | 7/2010 | Toguchi et al. ................. | 257/40 |
| 2011/0151110 A1 | * | 6/2011 | St. John ......................... | 427/58 |

FOREIGN PATENT DOCUMENTS

| | | |
|---|---|---|
| JP | 3173318 | 3/2001 |
| JP | 2003515622 | 5/2003 |
| WO | 2007114076 | 10/2007 |

* cited by examiner

*Primary Examiner* — Xiaoliang Chen
(74) *Attorney, Agent, or Firm* — Lucas & Mercanti, LLP

(57) ABSTRACT

Disclosed is a method of manufacturing a pattern electrode which excels in electroconductivity, transparency and etching property and a pattern electrode, the method comprising a step of applying a metal particle containing solution onto a substrate to form a conductive layer, a step of pattern printing a metal particle removing solution on a portion of the conductive layer, which is to be removed, and a step of washing the resulting printed material, whereby the portion of the conductive layer on which the metal particle removing solution has been printed is removed to form a non-conductive portion.

13 Claims, 1 Drawing Sheet

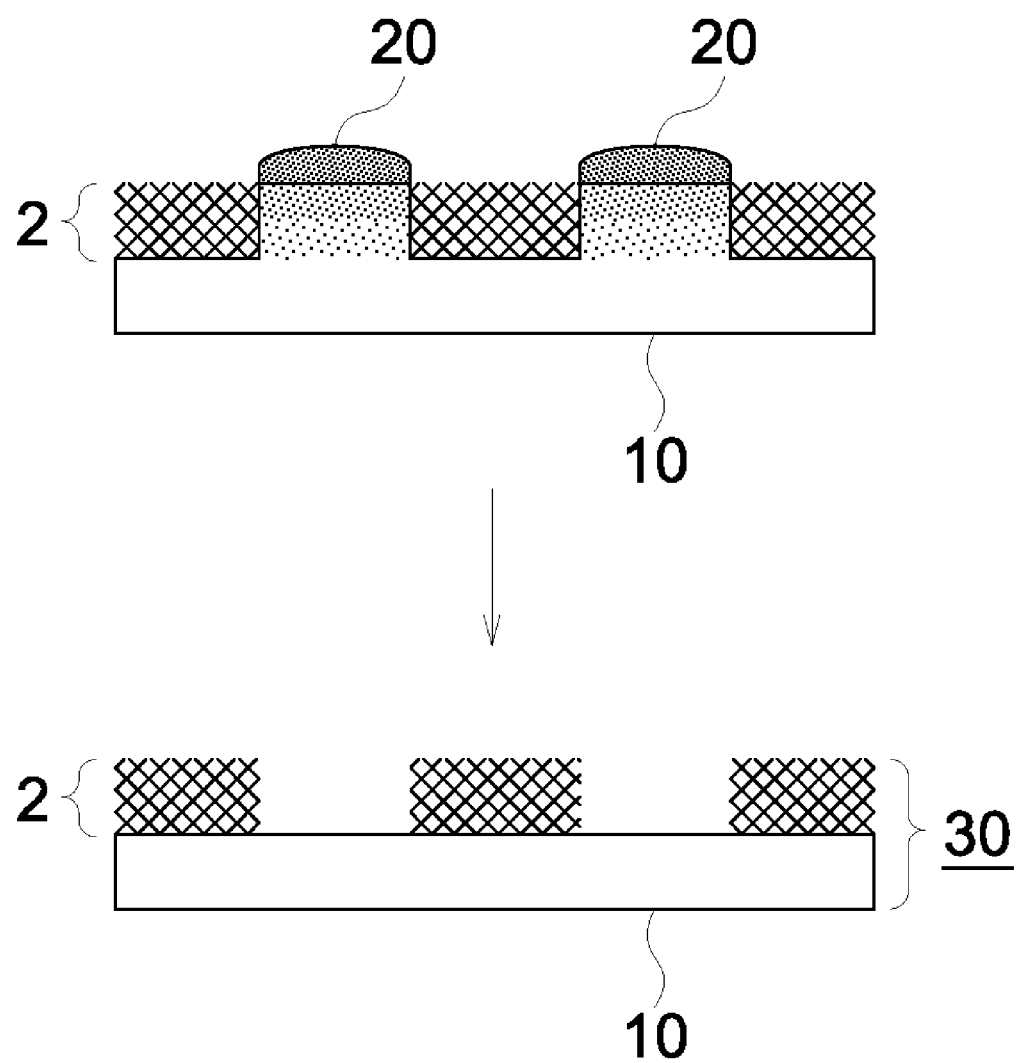

PATTERN ELECTRODE MANUFACTURING METHOD AND PATTERN ELECTRODE

This Application claims the priority of Japanese Application No. JP2009-211428 filed Sep. 14, 2009 and is incorporated by reference herein.

FIELD OF THE INVENTION

This invention relates to a method of manufacturing a pattern electrode which excels in electroconductivity, transparency and etching property, and a pattern electrode.

TECHNICAL BACKGROUND

Heretofore, a film of various metals such as Au, Ag and Pt and Cu; a film of metal oxides such as indium oxide doped with tin or zinc (ITO or IZO), zinc oxide doped with aluminum or gallium (AZO or GZO) and tin oxide doped with fluorine or antimony (FTO or ATO); a conductive film of nitrides such as TiN, ZrN and HfN and a conductive film of borides such as $LaB_6$ and the like are well-known as transparent conductive electrodes, and further, various electrodes including a combination thereof such as $Bi_2O_3/Au/Bi_2O_3$ and $TiO_2/Ag/TiO_2$ and the like are well-known. In addition to the transparent electrodes described above, a transparent electrode employing CNT (carbon nanotube) or a conductive polymer has been also proposed (for example, refer to "Technologies of Transparent Conductive Film", p. 80, published by Ohmsha, Ltd.).

However, the films of metals, nitrides or borides described above and a conductive polymer film are utilized only in a specific technological field such as electromagnetic wave shielding or in a touch panel field where even a relatively high resistance is acceptable, since high optical transparency and high conductivity are incompatible.

On the other hand, a metal oxide film is predominantly utilized as a transparent electrode, since it has compatibility between high optical transparency and high conductivity and excellent durability. Particularly, ITO is often utilized as a transparent electrode for various optoelectronics application, since it has good balance between optical transparency and conductivity, and can easily form a fine electrode pattern according to a wet process employing a solution as well as a vacuum process such as sputtering. However, the vacuum process such as sputtering requires expensive equipment in order to form a transparent conductive film, while the wet process requires annealing treatment at high temperature of 500° C. or higher in order to obtain high conductivity.

Besides the transparent electrodes described above, there are proposed a transparent conductive substrate a having random network structure comprised of self-organizing silver particles (for example, refer to WO 2007/114076) and a transparent electrode comprised of metal nanowires with fine meshes (for example, refer to US Patent Publication No. 2007/0074316). Particularly, metal nanowires employing silver nanowires provide compatibility between high conductivity and high transparency, due to high conductivity which silver itself.

In order to use a transparent electrode as an electrode for various devices such as an LCD, an electroluminescence element, a plasma display, an electrochromic display, a solar cell and a touch panel, it is necessary to form a pattern of the transparent electrode. As a method of forming a transparent electrode pattern employing metal nanowires, there are mentioned a method employing a printing ink containing electroconductive microwires (for example, refer to Japanese Patent O.P.I. Publication No. 2003-515622) and a method forming a nanowire pattern according to photolithography (for example, refer to US Patent Publication Nos. 2005/0196707 and 2008/0143906).

However, a method of directly pattern printing metal nanowires lowers electroconductivity due to increase of contact resistance between the metal nanowires caused by a binder. Patterning according to a conventional etching method comprises the steps of forming a resist pattern by a photoresist, imagewise exposing, developing, removing the resist by etching, and post-processing. In such a patterning, many steps before and after etching are required, and etching of the resist is carried out in a solution and therefore is likely to cause expansion or separation of the resist, which may result in lowering of etching accuracy. Further, severe temperature control is required. An etching solution used for etching a silver film is composed mainly of ammonia, which releases a strong odor and pollutes the working environment. A strong acid etching solution such as nitric acid has problems in that it has an adverse influence on the resist and releases a highly toxic gas. Furthermore, removal of the resist penetrating between the fine metal nanowire meshes may be insufficient, resulting in lowering of light transmittance, and on removal of the resist, metal particles or metal nanowires are also released. As described above, a conventional pattern formation method is not satisfactory. Dry etching, which is an etching method other than photolithography, enables high precision patterning, but is low in processing speed and in processing capability of the processing apparatus, resulting in cost increase. Besides the above, an etching method is disclosed in for example, Japanese Patent No. 3173318, in which a paste containing particulate substances and a solution having etching capability is applied to a material to be etched, however, this method requires high temperature and is not applied to a film substrate. Further, there is no disclosure of metal particles or metal nanowires in that patent.

SUMMARY OF THE INVENTION

This invention has been made in view of the above. An object of the invention is to provide a method of manufacturing a pattern electrode which excels in electroconductivity, transparency and etching property, and to provide a pattern electrode manufactured according to the method.

In the invention, a method of manufacturing a pattern electrode comprises the steps of applying a metal particle containing solution onto a substrate to form a conductive layer, pattern printing a metal particle removing solution on the conductive layer, and then washing the resulting printed material.

BRIEF DESCRIPTION OF THE DRAWING

FIG. 1 is a schematic view showing a manufacturing method of a pattern electrode.

DETAILED DESCRIPTION OF THE INVENTION

The present invention has been attained by any one of the following constitutions 1 to 12.

1. A method of manufacturing a pattern electrode comprising a substrate and provided thereon, a conductive layer containing metal particles, the method comprising the steps of applying a metal particle containing solution onto a substrate to form a conductive layer, pattern printing a metal particle removing solution on a portion of the conductive layer, which is to be removed, and then washing the resulting printed material, whereby that portion of the conductive layer on which the metal particle removing solution has been printed is removed to form a non-conductive portion.

2. The method of manufacturing a pattern electrode of item 1 above, wherein the metal of the metal particles is silver or copper.

3. The method of manufacturing a pattern electrode of item 1 above, wherein the metal particles are metal nanowires.

4. The method of manufacturing a pattern electrode of item 3 above, wherein the metal of the metal nanowires is silver or copper.

5. The method of manufacturing a pattern electrode of item 4 above, wherein the metal of the metal nanowires is silver.

6. The method of manufacturing a pattern electrode of item 3 above, wherein the metal nanowires have an average long axis length of from 3 to 500 μm and an average short axis length of from 10 to 300 nm.

7. The method of manufacturing a pattern electrode of item 1 above, wherein the metal particle removing solution contains an organometallic complex salt and a thiosulfate.

8. The method of manufacturing a pattern electrode of item 7 above, wherein the organometallic complex salt is an organic complex salt of iron (III).

9. The method of manufacturing a pattern electrode of item 8 above, wherein the organic complex salt of iron (III) is an iron (III)-aminopolycarboxylic acid complex salt.

10. The method of manufacturing a pattern electrode of item 7 above, wherein the metal particle removing solution further contains a water soluble binder.

11. The method of manufacturing a pattern electrode of item 10 above, wherein the water soluble binder is sodium carboxymethylcellulose.

12. The method of manufacturing a pattern electrode of item 1 above, wherein the pattern printing is carried out so as to form a metal particle removing solution layer with a thickness of from 10 μm to 2 mm on the conductive layer.

13. A pattern electrode manufactured according to the method of manufacturing a pattern electrode of any one of items 1 through 12 above.

EFFECTS OF THE INVENTION

The present invention can easily provide a method of manufacturing a pattern electrode with excellent conductivity, transparency and etching properties and a pattern electrode manufactured according to the method.

The pattern electrode manufacturing method of the invention is a method of manufacturing a pattern electrode formed on a substrate, which is comprised of a conductive layer containing metal particles. The method is characterized in that it comprises a step of applying a metal particle containing solution onto a substrate to form a conductive layer, a step of pattern-printing a metal particle removing solution on the conductive layer, and a step of washing the resulting printed material. The techniques as described in items 1 through 13 above share this characteristic.

As an embodiment of the invention, it is preferred that the metal particles are metal nanowires in view of effectively exhibiting the effect of the invention. Further, it is also preferred that the metal of the metal particles is silver or copper.

It is preferred in the invention that the metal particle removing solution contains an organometallic complex salt or a thiosulfate. It is also preferred in the invention that the metal particle removing solution contains a water soluble binder.

Next, the present invention and embodiments for carrying the present invention will be explained in detail below.

[Outline of Pattern Electrode Manufacturing Method]

The outline of the pattern electrode manufacturing method of the invention is shown in FIG. 1. FIG. 1 is a schematic view showing a pattern electrode manufacturing method in which a conductive layer 2 containing metal particles formed on a substrate 10 is treated with a metal particle removing solution 20, thereby forming a pattern electrode 30. In this method, the portion of a conductive layer 2, onto which the metal particle removing solution 20 has been applied, is removed (etched) to form a non-conductive portion.

The pattern electrode manufacturing method of the invention is one manufacturing a pattern electrode comprised of a conductive layer containing metal particles formed on a substrate. The pattern electrode manufacturing method is characterized in that the metal particle removing solution is pattern printed on the conductive layer, followed by washing (water washing).

[Substrate]

The substrates employed in the present invention are not particularly limited, and material, shape, structure, thickness or hardness thereof may be appropriately selected from those known in the art. Those having a high light transmittance are preferred.

Examples of the substrates include a polyester resin film such as a polyethylene terephthalate (PET) film, a polyethylene naphthalate film or a modified polyester film; a polyolefin resin film such as a polyethylene (PE) film, a polypropylene (PP) film, a polystyrene film, or a cycloolefin resin film; a vinyl resin film such as a polyvinyl chloride film, or a polyvinylidene chloride film; a polyvinyl acetal resin film such as polyvinyl butyral resin film; a polyether ether ketone (PEEK) resin film; a polysulfone (PSF) resin film; a polyethersulfone (PES) resin film; a polycarbonate (PC) resin film; a polyamide resin film; a polyimide resin film; an acryl resin film; and a triacetyl cellulose (TAC) resin film. A resin film having a transmittance of 80% or more in the visible wavelength regions (380-780 nm) is preferably applicable in the present invention. Among these, a biaxially-oriented polyethylene terephthalate film, a biaxially-oriented polyethylene naphthalate film, a polyethersulfone film or a polycarbonate film is preferred from a viewpoint of transparency, heat resistance, easy handling, strength and cost, and a biaxially-oriented polyethylene terephthalate film, a biaxially-oriented polyethylene naphthalate film is more preferred.

In order to secure the wettability and adhesion property of a coating solution, the substrate used in the present invention can be subjected to surface treatment or provided with an easy adhesion layer. A well-known technique can be used with respect to the surface treatment or the easy adhesion layer. Examples of the surface treatment include surface activating treatment such as corona discharge treatment, flame treatment, ultraviolet treatment, high-frequency wave treatment, glow discharge process, activated plasma treatment or laser treatment. Examples of materials for the easy adhesion layer include polyester, polyamide, polyurethane, a vinyl copolymer, a butadiene copolymer, an acryl copolymer, a vinylidene copolymer and an epoxy copolymer. When a film substrate is a biaxially-drawn polyethylene terephthalate film, an easy adhesion layer having a refractive index of from 1.57 to 1.63, which is adjacent to the film, reduces reflection at an interface between the film and the easy adhesion layer and increases transmittance, which is more preferred.

Adjustment of a refractive index can be achieved by adjusting suitably a content ratio of tin oxide sol or a cerium oxide sol which has a comparatively high refractive index to a binder resin, and then coating them on the film substrate. The easy adhesion layer may be a single layer or may be two or more layers thereof in order to increase adhesion property. A barrier coat layer or a hard coat layer may be beforehand formed on the film substrate, if required.

[Conductive Layer]

The conductive layer in the invention is characterized in that it contains metal particles. The method of forming the conductive layer in the invention is not specifically limited and it is a liquid phase layer formation method in which a dispersion solution containing metal particles is coated on a substrate and dried to form a layer. As the coating method is preferred a roller coating method, a bar coating method, a dip coating method, a spin coating method, a casting method, a die coating method, a blade coating method, a bar coating method, a gravure coating method, a curtain coating method, a spray coating method or a doctor coating method. When the surface of the conductive layer is required to be smooth, a dispersion solution of metal particles is coated on a first smooth substrate having a releasing property and dried to form a metal particle layer, and the metal particle layer is transferred on a second substrate through a resin layer. The resin constituting the resin layer is not specifically limited as long as it is transparent in the visible wavelength regions (i.e., it has a high transmittance. The resin may be a curable resin or a thermoplastic resin, and is preferably a curable resin. Examples of the curable resin include a heat curable resin, an ultraviolet curable resin, and an electron beam curable resin, and among these curable resins, an ultraviolet curable resin is preferred since the appliance for resin curing is simple, and it excels in workability. The resin layer is preferably comprised of an acrylic resin and an epoxy resin, from a viewpoint of transparency. Further, a conductive layer containing a conductive polymer or metal oxides or a binder resin layer may be provided as necessary.

[Metal Particles]

The metal particles in the invention imply particle-shaped metals having a particle diameter of from an atomic scale to a nanometer (nm) size. The metal particles have an average particle size of preferably from 10 to 300 nm and more preferably from 30 to 200 nm. A metal used in the metal particles in the invention is preferably silver or copper in view of electrical conductivity. The metal may be silver alone or copper alone or may be a mixture of silver and copper, an alloy of silver or copper, silver plated with copper or copper plated with silver.

The metal particles in the invention may be particle-shaped, rod-shaped or wire-shaped as long as they have a shorter diameter of a nano size. The metal particles are preferably wire-shaped metal nanowires in view of electrical conductivity and transparency.

Generally, metal nanowires indicate a substance having a linear structure which is composed of a metallic element as a main constituent and has a diameter of from an atomic scale to a nanometer (nm) size.

In order to form a long conductive path by one metal nanowire, the metal nanowires in the invention have an average long axis length of preferably not less than 3 μm, more preferably from 3 to 500 μm, and still more preferably from 3 to 300 μm. In addition, the relative standard deviation of the long axis length of the metal nanowires is preferably 40% or less.

Moreover, the average short axis length of the metal nanowires is not specifically limited but a smaller average short axis length is preferred from a viewpoint of transparency, on the other hand, a larger average short axis length is preferred from a viewpoint of electrical conductivity. In the invention, the average short axis length of the metal nanowires is preferably from 10 to 300 nm and more preferably from 30 to 200 nm. In addition, the relative standard deviation of the short axis length of the metal nanowires is preferably 20% or less. The metal nanowires in the conductive layer preferably contact each other, and more preferably contact each other to be in the form of a mesh. A conductive layer, in which the metal nanowires contact each other or contact each other to be in the form of a mesh, can be easily formed employing the liquid phase film formation method as described above.

With respect to definition of the long axis length, the short axis length, the average long axis length, the average short axis length of the metal nanowires in the invention, explanation will be made below.

When two straight lines parallel to each other are drawn to be tangent to a projected image of the metal nanowire at two points on the outer circumference of the projected image, a length of the longest straight line segment of straight line segments connecting the two points on the outer circumference of the projected image is defined as the long axis length of the silver nanowire, and a length of a straight line segment, which is a perpendicular bisector of the longest straight line segment, and has both ends on the outer circumference of the projected image, is defined as the short axis length of the silver nanowire. Further, arithmetic averages of long axis lengths and short axis lengths of the arbitrarily selected 100 metal nanowires are defined as the average long axis length of the metal nanowires and the average short axis length of the metal nanowires, respectively. The long axis length, the short axis length, the average long axis length, the average short axis length of the metal nanowires in the invention are determined employing an electron micrograph of the metal nanowires being taken through a transmission electron microscope (TEM).

In the present invention, there is no restriction in particular to a metal nanowire manufacturing method. It is possible to manufacture metal nanowires via well-known methods such as a liquid phase method or a gas phase method. The concrete manufacturing method is not specifically limited, and a conventional method can be applied. For example, the manufacturing method of Ag nanowires may be referred to Adv. Mater., 2002, 14, 833-837 and Chem. Mater., 2002, 14, 4736-4745; the manufacturing method of Cu nanowires may be referred to Japanese Patent O.P.I. Publication No. 2002-266007; while the manufacturing method of Co nanowires may be referred to JP-A No. 2004-149871. The manufacturing method of Ag nanowires can be preferably applied to the present invention, since silver nanowires can be easily manufactured in an aqueous solution and the electrical conductivity of silver is highest of all metals.

[Metal Particle Removing Solution]

The composition of the metal particle removing solution used in the invention is preferably that of a bleach fixer used in developing treatment of a silver halide color photographic light sensitive material from a viewpoint of safety in handling and etching property of metal particles, particularly silver particles. The metal particle removing solution is preferably an aqueous solution, however, it may be a solution of an organic solvent such as ethanol, as long as the organic solvent can dissolve beaching agents or fixing agents described later.

As a bleaching agent used in a bleach fixer, a well-known bleaching agents are usable, and an organometallic complex salt such as an organic complex salt of iron (III) (for example, a complex salt of aminopolycarboxylic acids); an organic acid such as citric acid, tartaric acid or a malic acid or the like; a persulfate and a hydrogen peroxide are preferred.

Among these, an organic complex salt of iron (III) is especially preferred in view of rapid treatment and prevention of environmental pollution. Examples of an aminopolycarboxylic acid or its salt useful to form an organic complex of iron (III) include biodegradable SS-ethylenediamine disuccinic acid, N-(2-carboxylatoethyl)-L-aspartic acid, β-alanine diacetic acid, methylimino diacetic acid, ethylenediamine tetraacetic acid, diethylenetriamine pentaacetic acid, 1,3-diaminopropane tetraacetic acid, propylenediamine tetraacetic acid, nitrilotriacetic acid, cyclohexanediamine tetraacetic acid, imino diacetic acid, glycol ether diamine tetraacetic acid, and a compound represented by Formula (I) or (II) disclosed in EP Patent No. 0789275.

These compounds may be any of sodium, potassium, lithium, and an ammonium salt. With respect to SS-ethylenediamine disuccinic acid, N-(2-carboxylatoethyl)-L-aspartic acid, β-alanine diacetic acid, ethylenediamine tetraacetic acid, 1,3-diaminopropane tetraacetic acid, and a methylimino diacetic acid among the above compounds, their iron (III) complex salt is preferred. These ferric ion complex salts may be used in the form of a complex, or a ferric salt such as ferric sulfate, ferric chloride, ferric nitrate, ferric sulfate ammonium or ferric phosphate may be used together with a chelating agent such as aminopolycarboxylic acid to form a ferric ion complex salt in the solution. Further, a chelating agent may be used exceeding an amount necessary to form a complex salt with a ferric ion. Among the iron complex salts, an iron (III)-aminopolycarboxylic acid complex salt is preferred. The addition amount of the aminopolycarboxylic acid iron complex salt is from 0.01 to 1.0 mol/liter, preferably from 0.05 to 0.50 mol/liter, more preferably from 0.10 to 0.50 mol/liter, and still more preferably from 0.15 to 0.40 mol/liter.

A fixing agent used in a bleach fixer is a known fixing agent, i.e., a water soluble silver halide solvent, for example, a thiosulfate such as sodium thiosulfate or ammonium thiosulfate; a thiocyanate such as sodium thiocyanate or ammonium thiocyanate; a thioether compound such as ethylene bisthioglycolic acid, 3,6-dithia-1,8-octane diol; or thiourea. These fixing agents can be used singly or as an admixture of two or more kinds thereof. Further, a special bleach fixer can be used which is comprised of a combination of a fixing agent disclosed in Japanese Patent O.P.I. Publication No. 55-155354 with a large amount of a halide such as potassium iodide. In the present invention, a thiosulfate, especially ammonium thiosulfate is preferred. The content of a fixing agent is preferably from 0.3 to 2.0 mol and more preferably from 0.5 to 1.0 mol per one liter of the bleach fixer.

The bleach fixer used in the present invention has a pH of preferably from 3 to 8, and more preferably 4 to 7. In order to adjust the pH, hydrochloric acid, sulfuric acid, nitric acid, bicarbonate, ammonia, potassium hydroxide, sodium hydroxide, sodium carbonate or potassium carbonate may be added, if desired It is preferred that a viscosity increasing agent is added to the bleach fixer used in the invention in order to give viscosity, which is suitable for a printing method used, to the bleach fixer. Examples of the viscosity increasing agent include a water soluble binder or fine silica particles. The molecular weight of the water soluble binder can be arbitrarily selected according to required viscosity of the bleach fixer.

In the invention, the viscosity of the metal particle removing solution is preferably from 0.01 to 1000 Pa·s and more preferably from 0.05 to 500 Pa·s.

In addition to the water soluble binder, various defoaming agents or surfactants, polyvinyl pyrrolidone or an organic solvent can be contained in the bleaching fixer. It is preferred that the bleach fixer contains, as a preserving agent, a sulfite ion releasing compound such as a sulfite (for example, sodium sulfite, potassium sulfite or ammonium sulfite); a bisulfite (for example, ammonium bisulfite, sodium bisulfite or potassium bisulfite) or a metabisulfite (for example, potassium metabisulfite, sodium metabisulfite or ammonium metabisulfite); or an arylsulfinic acid such as p-toluene sulfinic acid or m-carboxybenzene sulfinic acid. It is preferred that these compounds are contained in the bleach fixer in an amount of approximately 0.02 to 1.0 mol/liter in terms of a sulfite ion or a sulfinate ion.

Beside the compounds described above, ascorbic acid, a carbonyl bisulfite adduct or a carbonyl compound may be added as the preserving agent. Further, a buffering agent, a chelating agent, a defoaming agent or a mildew-proofing agent may also added, if desired.

[Water Soluble Binder]

As a water soluble binder used in the invention, there are mentioned a synthetic water soluble binder and a natural water soluble binder.

As the synthetic water soluble binder, there are mentioned those having in the molecule a nonionic group, those having in the molecule an anionic group, and those having in the molecule a nonionic group and an anionic group. Examples of the nonionic group include an ether group, an ethyleneoxy group and a hydroxyl group, and examples of the anionic group include a sulfonic acid group or its salt group, a carboxyl group or its salt group and a phosphoric acid group or its salt group.

The synthetic water soluble binder may be a homopolymer or a copolymer of one monomer unit with one or more kinds of other monomer units. The copolymer may be a copolymer having a hydrophobic monomer unit as long as it retains water solubility, although it is necessary that the content of the hydrophobic monomer unit in the copolymer is in the range that does not have an adverse effect.

As the natural water soluble binder, there are mentioned those having in the molecule a nonionic group, those having in the molecule an anionic group, and those having in the molecule a nonionic group and an anionic group. The natural water soluble binder in the invention is described in detain in "Suiyoseikobunshi Mizubunsangata Jusi no Sogogijutsu Siryoshuu" (published by Keiei Kaihatu Senta Shuppanbu). The natural water soluble binder is preferably lignin, starch, pullulan, cellulose, alginic acid, dextran, dextrin, guar gum, gum arabic, pectin, casein, agar, xanthan gum, cyclodextrin, locust bean gum, tragacanth gum, carrageenan, glycogen, laminaran, lichenin, nigeran or their derivative.

As the derivatives of the natural water soluble binder are preferred those sulfonated, those carboxylated, those phosphorylated, those sulfoalkylated, those carboxyalkylated, those alkylphosphorylated and their salt, those modified with polyoxyalkylene oxide (for example, polyethylene oxide polyglycerin or polypropylene oxide), or those alkylated (for example, methylated, ethylated or benzylated).

Among the natural water soluble binders, glucose polymers or its derivatives are preferred. Among the glucose polymers or its derivatives, starch, glycogen, cellulose, lichenin, dextran, dextrin, cyclodextrin and nigeran are preferred, and cellulose, dextrin, cyclodextrin and their derivatives are especially preferred.

Examples of the cellulose derivatives include methylcellulose, hydroxyethylcellulose, and sodium carboxymethylcellulose (hereinafter also referred to as CMC). Among these, CMC is preferred since it is highly soluble in water. The molecular weight of the water soluble binder in the invention can be arbitrarily selected according to viscosity to be required.

[Pattern Printing]

As a method of pattern printing the metal particle removing solution in the invention, there are printing methods such as a letterpress (typographic) printing method, a porous (screen) printing method, a lithographic (offset) printing method, an intaglio (gravure) printing method, a spray printing method and an ink-jet printing method. The metal particle removing solution in the invention is pattern printed on a portion of the conductive layer in the invention containing metal particles, which is unnecessary to form a pattern electrode, and washed to remove the metal particles at that portion, whereby a pattern electrode can be easily formed.

The pattern printing thickness of the metal particle removing solution in the invention can be appropriately varied due to thickness or area of a metal particle-containing conductive layer to be removed, but is preferably from 10 μm to 2 mm from a viewpoint of reactivity between the metal particle removing solution and the metal particles in the conductive layer or prevention of lateral spread of the metal particle removing solution printed.

The washing in the invention, which is carried out after the pattern printing of the metal particle removing solution, is not specifically limited but is preferably is carried out employing water. It is also preferred that the washing is carried out with flowing water or is carried out in water with stirring. The washing time is time during which the metal particle removing solution is completely washed off, and is preferably at least 10 seconds.

[Pattern Electrode]

The pattern electrode in the invention refers to an electrode having a conductive portion comprised of a conductive layer containing the metal particles described previously and a non-conductive portion in which the metal particle removing solution is pattern printed on the conductive layer containing the metal particles to remove the metal particles, employing the pattern electrode manufacturing method of the invention.

It is desirable that the total light transmittance of the conductive portion in the pattern electrode of the present invention is at least 60%, preferably at least 70%, and more preferably at least 80%. The total light transmittance can be determined according to a well-known method employing a spectrophotometer and the like.

The electrical resistance value of the conductive portion in the pattern electrode of the invention is preferably at most $10^2$ Ω/□, and more preferably at most 10 Ω/□ in terms of surface specific resistance. The surface specific resistance can be determined for example, based on JIS K6911, ASTM D257. Further, it can be easily determined employing a commercially available surface resistance meter.

An anchor coat or a hard coat can be provided in the pattern electrode of the invention. Further, a conductive layer containing a conductive polymer or metal oxides may be provided if necessary.

The pattern electrode of the invention is preferably applied to a transparent electrode for LCD, an electroluminescence element, a plasma display, an electrochromic display, a solar cell or a touch panel; an electronic paper or an electromagnetic wave shielding material.

EXAMPLES

Next, the present invention will be explained employing examples, but the invention is not specifically limited thereto. In the examples, "%" represents "% by mass", unless otherwise specified.

[Preparation of Pattern Electrode TCF-1 (Comparative Example)]

A solution of silver nanowires with an average short axis length of 75 nm and an average long axis length of 35 μm as metal particles was prepared employing polyvinyl pyrrolidone K30 with a molecular weight of 50,000 (produced by ISP Co., Ltd.) according to the method described in Adv. Mater., 2002, 14, 833-837, and filtered employing a ultrafiltration membrane, and washed with water to obtain the silver nanowires. The resulting silver nanowires were re-dispersed in an aqueous solution in which hydroxypropylmethyl cellulose 60SH-50 (produced by Shin-etsu Kagaku Kogyo Co., Ltd.) was contained in an amount of 25% by mass based on the amount of the silver to obtain a silver nanowire dispersion solution.

The silver nanowire dispersion solution was applied onto a polyethylene terephthalate film substrate subjected to adhesion assisting treatment (hereinafter referred to as highly adhesive polyethylene terephthalate film substrate), trade name Cosmoshine A4100 (produced by Toyobo Co., Ltd.), using a spin coater, and dried to form a silver nanowire layer with a coating amount of 0.05 g/m². Thereafter, the resulting silver nanowire layer was subjected to calendar treatment, and then a stripe-shaped Pattern Electrode TCF-1 having a conductive portion pattern with a width of 10 mm and a pattern interval of 10 mm, was prepared according to well-known photolithography. The Pattern Electrode TCF-1 thus prepared was visually observed. No residual metal particles were observed in the non-conductive portion, however, both ends in the width direction of the conductive portion in the stripe-shaped pattern were etched by approximately 0.5 mm by width, and width reduction of the conductive portion was observed.

[Preparation of Pattern Electrode TCF-2 (Comparative Example)]

A printing plate having a stripe-shaped pattern with a printing pattern width of 10 mm and a pattern interval of 10 mm was mounted on a gravure coating machine, K Printing Proofer (produced by MATSUO SANGYO Co., Ltd.), and gravure printing was carried out employing a silver nanowire dispersion solution used in the preparation of TCF-1 above, whose viscosity was adjusted to 1 Pa·s (1000 cP) with sodium carboxymethylcellulose (C5013 produced by SIGMA-ALDRICH Ca, Ltd., hereinafter also referred to as CMC), while controlling the printing times, so that pattern portions with a silver nanowire coating amount of 0.05 g/m² were printed on a highly adhesive polyethylene terephthalate film substrate, trade name Cosmoshine A4100 (produced by Toyobo Co., Ltd.). Thus, a stripe-shaped Pattern Electrode TCF-2 was prepared.

[Preparation of Pattern Electrode TCF-3 (Inventive Example)]

<Preparation of Metal Particle Removing Solution BF-1)

| | |
|---|---|
| Ammonium Ferric ethylenediaminetetraacetate | 60 g |
| Ethylenediaminetetraacetic acid | 2 g |
| Sodium metabisulfite | 15 g |
| Ammonium thiosulfate | 70 g |
| Maleic acid | 5 g |

Water was added to the above composition to make a 1 liter solution and adjusted to a pH of 5.5 with sulfuric acid or aqueous ammonia. Thus, Metal Particle Removing Solution BF-1 was prepared.

The silver nanowire dispersion solution used in the preparation of TCF-1 above was applied onto a highly adhesive polyethylene terephthalate film substrate, trade name Cosmoshine A4100 (produced by Toyobo Co., Ltd.), using a spin coater, and dried to form a silver nanowire layer with a coating amount of 0.05 g/m². Thereafter, the resulting silver nanowire layer was subjected to calendar treatment. A printing plate having a stripe-shaped pattern with a printing pattern width of 10 mm and a pattern interval of 10 mm was mounted on a gravure coating machine, K Printing Proofer (produced by MATSUO SANGYO Co., Ltd.), and gravure printing was carried out employing a metal particle removing solution in which the viscosity of Metal Particle Removing Solution BF-1 was adjusted to 0.5 Pa·s (500 cP) with CMC, while controlling the printing times, so that the metal particle removing solution was applied on the silver nanowire layer to give a coating thickness of 30 μm. After printing, the resulting printed material was allowed to stand for 1 minute, and then washed for 1 minute with flowing water. Thus, a stripe-shaped Pattern Electrode TCF-3 was prepared.

[Preparation of Pattern Electrode TCF-4 (Inventive Example)]

Printing was carried out in the same manner as in Pattern Electrode TCF-3, except that screen printing was carried out instead of gravure printing, employing a polyester mesh for screen printing 255T (produced by Mitani Micronics Co., Ltd.) having a stripe-shaped pattern with a printing pattern width of 10 mm and a pattern interval of 10 mm and a metal particle removing solution in which the viscosity of the Metal Particle Removing Solution BF-1 prepared in TCF-3 was adjusted to 10 Pa·s (10000 cP) with CMC, so that the metal particle removing solution was applied on the silver nanowire layer to give a coating thickness of 30 μm. After printing, the resulting printed material was allowed to stand for 1 minute, and then washed for 1 minute with flowing water. Thus, a stripe-shaped Pattern Electrode TCF-4 was prepared.

[Preparation of Pattern Electrode TCF-5 (Inventive Example)]

Printing was carried out in the same manner as in Pattern Electrode TCF-3, except that ink jet printing was carried out instead of gravure printing, employing an ink jet printer and a metal particle removing solution in which the viscosity of the Metal Particle Removing Solution BF-1 prepared in TCF-3 was adjusted to 30 Pa·s (30 cP) with CMC to form a stripe-shaped pattern with a printing pattern width of 10 mm and a pattern interval of 10 mm, so that the metal particle removing solution was applied on the silver nanowire layer to give a coating thickness of 30 μm. After printing, the resulting printed material was allowed to stand for 1 minute, and then washed for 1 minute with flowing water. Thus, a stripe-shaped Pattern Electrode TCF-4 was prepared.

[Preparation of Pattern Electrode TCF-6 (Inventive Example)]

A stripe-shaped Pattern Electrode TCF-6 was prepared in the same manner as in TCF-4, except that a metal particle removing solution in which the viscosity of the Metal Particle Removing Solution BF-1 was adjusted to 10 Pa·s (10000 cP) with a viscosity increasing agent Aerosil #200 (silica particles, produced by Nippon Aerosil Co., Ltd.) used. The screen mesh after printing was observed, and partial clogging of the mesh was observed.

[Preparation of Pattern Electrode TCF-7 (Inventive Example)]

As the substrate, a biaxially stretched polyethylene terephthalate film, trade name Lumirror U 46 (produced by Toray Co., Ltd.) having a hydrophilic layer on one side thereof was employed, the hydrophilic layer being formed by hydrophilization treatment. The following self-organizing silver particle layer formation solution C-1 was coated as metal particles on the hydrophilic layer of the film, allowed to stand at 25° C. for 1 minute so that the silver particles was self-organized in a network form to form a random network silver particle layer, and processed at 150° C. for 1 minute. Thereafter, the resulting film was immersed in 25° C. acetone (Special grade, produced by NACALAI TESQUE, INC.) for 30 seconds, taken out from the acetone and dried at 25° C. for 1 minute. Subsequently, the resulting film was immersed in a 25° C. 1N (1 mol/L) hydrochloric acid solution, N/10-hydrochloric acid (produced by NACALAI TESQUE, INC.) for 1 minute, taken out from the solution, and dried at 150° C. for 1 minute. Thus, a network silver particle layer formation film was prepared.

(Self-Organizing Silver Particle Layer Formation Solution C-1)

| | |
|---|---|
| BYK-410 (produced by BYK Chemie Co., Ltd.) | 0.11% |
| SPAN-80 (produced by Tokyo Kasei Kogyo Co., Ltd.) | 0.11% |
| Dichloroethane | 75.63% |
| Cyclohexanone | 0.42% |
| Silver Powder (with an average particle size of 70 nm) | 3.59% |
| BYK-348 (0.02% aqueous solution; produced by BYK Chemie Co., Ltd.) | 19.98% |
| Zonyl FSH (produced by Dupont Co., Ltd.) | 0.08% |
| Butver B-76 (produced by Solutia Co., Ltd.) | 0.08% |

Like TCP-3, a printing plate having a stripe-shaped pattern with a printing pattern width of 10 mm and a pattern interval of 10 mm was mounted on a gravure coating machine, K Printing Proofer (produced by MATSUO SANGYO Co., Ltd.), and gravure printing was carried out employing a metal particle removing solution in which the viscosity of Metal Particle Removing Solution BF-1 was adjusted to 0.5 Pa·s (500 cP) with CMC, while controlling the printing times, so that the metal particle removing solution was applied on the network silver particle layer formation film layer to give a coating thickness of 30 μm. After printing, the resulting printed material was allowed to stand for 3 minutes, and then washed for 1 minute with flowing water. Thus, a stripe-shaped Pattern Electrode TCF-7 was prepared.

[Preparation of Pattern Electrode TCF-8 (Inventive Example)]

A stripe-shaped Pattern Electrode TCF-8 was prepared in the same manner as in TCF-3, except that copper nanowires with an average of 20 nm and a average length of 10 μm, which was prepared according to the method as described in Japanese Patent O.P.I. Publication No. 202-266007 was used instead of the silver nanowires.

[Preparation of Pattern Electrode TCF-9 (Inventive Example)]

The silver nanowire dispersion solution used in the preparation of TCF-1 above was coated onto a hard coat layer of a polyethylene terephthalate film substrate subjected to hard coat processing, using a spin coater, and dried to form a silver nanowire layer with a coating amount of 0.05 g/m². Thereafter, the resulting silver nanowire layer was subjected to calendar treatment. Further, a UV curable resin Optomer NN (produced by JSR Co., Ltd.) was coated on an adhesive layer of a highly adhesive polyethylene terephthalate film substrate, employing a spin coater, so as to form a resin layer with a thickness of 3 μm. Subsequently, the silver nanowire layer coated film substrate prepared above was laminated under pressure onto the resin layer so that the resin layer face the silver nanowire layer, and the resulting laminate was subjected to UV irradiation from the substrate side of the highly adhesive polyethylene terephthalate film substrate to cure the UV curable resin, and then the hard coat-processed film substrate was separated from the laminate to obtain a silver nanowire transfer film. Like TCP-3, a printing plate having a stripe-shaped pattern with a printing pattern width of 10 mm and a pattern interval of 10 mm was mounted on a gravure coating machine, K Printing Proofer (produced by MATSUO SANGYO Co., Ltd.), and gravure printing was carried out employing a metal particle removing solution in which the viscosity of Metal Particle Removing Solution BF-1 was adjusted to 0.5 Pa·s (500 cP) with CMC, while controlling the printing times, so that the metal particle removing solution was applied on the silver nanowire layer of the silver nanowire transfer film to give a coating thickness of 30 μm. After printing, the resulting printed material was allowed to stand for 1 minute, and then washed for 1 minute with flowing water. Thus, a stripe-shaped Pattern Electrode TCF-9 was prepared.

[Preparation of Pattern Electrode TCF-10 (Inventive Example)]
<Preparation of Metal Particle Removing Solution BF-2)

| | |
|---|---|
| Ammonium ferric diethylenetriaminepentaacetate bihydrate | 65 g |
| Diethylenetriaminepentaacetatic acid | 3.0 g |
| Ammonium thiosulfate (aqueous 70% solution) | 100 ml |
| 2-Amino-5-mercapto-1,3,4-thiadiazole | 2.0 g |
| Ammonium sulfite (aqueous 40% solution) | 27.5 ml |

Water was added to the above composition to make a 1 liter solution and adjusted to a pH of 5.0 with potassium carbonate or glacial acetic acid.

A stripe-shaped Pattern Electrode TCF-10 was prepared in the same manner as in TCF-3, except that the metal particle removing solution BF-2, whose viscosity was adjusted to 0.5 Pa·s (500 cP) with CMC, was used instead of the metal particle removing solution BF-1.

[Preparation of Pattern Electrode TCF-11 (Inventive Example)]
Screen printing was carried out employing a polyester mesh for screen printing MFT 325 (produced by Mitani Micronics Co., Ltd.) having a grid pattern with a printing pattern width of 25 μm and a pattern interval of 500 μm and a silver nanoparticle containing paste MDot-SLP (produced by Mitsuboshi Belt Co., Ltd.), so that the grid pattern layer was formed on a highly adhesive polyethylene terephthalate film substrate, trade name Cosmoshine A4100 (produced by Toyobo Co., Ltd.), and the printed matter was heated at 120° C. for 30 minutes to obtain a silver grid film. Subsequently, like TCP-3, a printing plate having a stripe-shaped pattern with a printing pattern width of 10 mm and a pattern interval of 10 mm was mounted on a gravure coating machine, K Printing Proofer (produced by MATSUO SANGYO Co., Ltd.), and gravure printing was carried out employing a metal particle removing solution in which the viscosity of Metal Particle Removing Solution BF-1 was adjusted to 0.5 Pa·s (500 cP) with CMC, while controlling the printing times, so that the metal particle removing solution was applied on the silver grid pattern layer of the silver grid film to give a coating thickness of 30 μm. After printing, the resulting printed material was allowed to stand for 3 minutes, and then washed for 1 minute with flowing water. Thus, a stripe-shaped Pattern Electrode TCF-11 was prepared.

The inventive pattern electrodes 3 through 11 prepared above were visually observed, and it proved that there were no residual metal particles in the non-conductive portions thereof, and no width reduction in the conductive portions thereof, showing an excellent etching property.

<<Evaluation of Pattern Electrode>>
The surface specific resistance and transmittance of pattern electrodes 1 through 11 were evaluated according to the following method.

(Surface Specific Resistance)
The surface specific resistance was measured by means of a resistivity measurement meter Loresta GP produced by Dia Instruments Co., Ltd., and the surface specific resistance at the stripe-shaped pattern portions was measured employing a four terminal method.

(Light Transmittance)
With respect to light transmittance, the total light transmittance of the conductive portion of the stripe-shaped pattern electrode was determined through AUTOMATIC HAZE METER (MODEL TC-HIIIDP) produced by Tokyo Denshoku Co., Ltd.

TABLE 1

| Pattern Electrode No. | Metal Particles | Pattern Formation Method | Metal Particle Removing Solution | Water Soluble Binder | *1 | Remarks |
|---|---|---|---|---|---|---|
| TCF-1 | Silver Nanowires | *2 | — | — | — | Comparative |
| TCF-2 | Silver Nanowires | *3 | — | — | — | Comparative |
| TCF-3 | Silver Nanowires | *4 | BF-1 | CMC | 1 | Inventive |
| TCF-4 | Silver Nanowires | *5 | BF-1 | CMC | 1 | Inventive |
| TCF-5 | Silver Nanowires | *6 | BF-1 | CMC | 1 | Inventive |
| TCF-6 | Silver Nanowires | *5 | BF-1 | Aerosil #200 | 1 | Inventive |
| TCF-7 | (a) | *4 | BF-1 | CMC | 3 | Inventive |
| TCF-8 | Copper Nanowires | *4 | BF-1 | CMC | 1 | Inventive |
| TCF-9 | (b) | *4 | BF-1 | CMC | 1 | Inventive |
| TCF-10 | Silver Nanowires | *4 | BF-2 | CMC | 1 | Inventive |
| TCF-11 | (c) | *4 | BF-1 | CMC | 3 | Inventive |

| Pattern Electrode No. | Etching Property | Light Transmittance (%) | Surface Specific Resistance (Ω/□) | Remarks |
|---|---|---|---|---|
| TCF-1 | *7 | 74 | 36 | Comparative |
| TCF-2 | — | 79 | 208 | Comparative |
| TCF-3 | Good | 84 | 10 | Inventive |
| TCF-4 | Good | 84 | 10 | Inventive |
| TCF-5 | Good | 84 | 10 | Inventive |
| TCF-6 | Good *8 | 84 | 10 | Inventive |
| TCF-7 | Good | 82 | 12 | Inventive |
| TCF-8 | Good | 83 | 29 | Inventive |

TABLE 1-continued

| TCF-9  | Good | 80 | 15 | Inventive |
| TCF-10 | Good | 84 | 10 | Inventive |
| TCF-11 | Good | 79 | 1  | Inventive |

(a): Self-Organizing Silver Particle Layer Formation Solution C-1;
(b): Transfer of Silver Nanowires to Resin Layer;
(c): Silver Paste in Grid Pattern
*1: Time interval (minutes) from when printing of the metal particle removing solution was carried out until when washing was carried out
*2: The pattern electrode was formed according to a photolithography.
*3: The pattern electrode was formed, pattern coating the silver nanowires according to a gravure printing method.
*4: The pattern electrode was formed, pattern coating the metal particle removing solution according to a gravure printing method.
*5: The pattern electrode was formed, pattern coating the metal particle removing solution according to a screen printing method.
*6: The pattern electrode was formed, pattern coating the metal particle removing solution according to an ink jet printing method.
*7: Both ends in the width direction of the pattern electrode were etched 0.5 mm by width, and width reduction of the pattern electrode was observed.
*8: Partial clogging of the printing plate mesh after printing was observed.

As is apparent from table 1, Comparative Pattern Electrode TCF-1 exhibits lowering of light transmittance due to residual resist at the conductive portion, elevation of resistance at the conductive portion due to silver nanowire separation, and pattern width reduction due to over-etching, and Comparative Pattern Electrode TCF-2 exhibits lowering of light transmittance resulting from the binder for adjusting viscosity and marked elevation of resistance at the conductive portion resulting from increase in contact resistance between the silver nanowires. On the other hand, Inventive Pattern Electrodes exhibit high conductivity (see surface specific resistance), high transparency (see light transmittance) and excellent etching property without residual metal particles or without reduction of the pattern width. In Inventive Pattern Electrode TCF-6, clogging of the screen mesh after printing, which is considered to be due to silica particles used, is observed, however, the clogging matter is easily removed by washing, and completely removed by employing a water soluble binder as a viscosity increasing agent. In Inventive Pattern Electrode TCF-7 or 11, retention time, during which after printing of the metal particle removing solution on the conductive portions, the printed metal particle removing solution is retained on the conductive portions, is a little long, however, when the retention time is taken longer, etching can be carried out without problem, and when metal particles having a large specific area such as metal nanowires are used, etching can be carried out at shorter retention time.

What is claimed is:

1. A method of manufacturing a pattern electrode comprising a substrate and provided thereon, a conductive layer containing metal particles, the method comprising the steps of:
    applying a metal particle containing solution onto a substrate to form a conductive layer;
    pattern printing a metal particle removing solution on a portion of the conductive layer, which is to be removed; and
    washing the resulting printed material, whereby that portion of the conductive layer on which the metal particle removing solution has been printed is removed to form a non-conductive portion.

2. The method of manufacturing a pattern electrode of claim 1, wherein the metal of the metal particles is silver or copper.

3. The method of manufacturing a pattern electrode of claim 1, wherein the metal particles are metal nanowires.

4. The method of manufacturing a pattern electrode of claim 3, wherein the metal of the metal nanowires is silver or copper.

5. The method of manufacturing a pattern electrode of claim 4, wherein the metal of the metal nanowires is silver.

6. The method of manufacturing a pattern electrode of claim 3, wherein the metal nanowires have an average long axis length of from 3 to 500 µm and an average short axis length of from 10 to 300 nm.

7. The method of manufacturing a pattern electrode of claim 1, wherein the metal particle removing solution contains an organometallic complex salt and a thiosulfate.

8. The method of manufacturing a pattern electrode of claim 7, wherein the organometallic complex salt is an organic complex salt of iron (III).

9. The method of manufacturing a pattern electrode of claim 8, wherein the organic complex salt of iron (III) is an iron (III)-aminopolycarboxylic acid complex salt.

10. The method of manufacturing a pattern electrode of claim 7, wherein the metal particle removing solution further contains a water soluble binder.

11. The method of manufacturing a pattern electrode of claim 10, wherein the water soluble binder is sodium carboxymethylcellulose.

12. The method of manufacturing a pattern electrode of claim 1, wherein the pattern printing is carried out so as to form a metal particle removing solution layer with a thickness of from 10 µm to 2 mm on the conductive layer.

13. A pattern electrode manufactured according to the method of manufacturing a pattern electrode of claim 1.

* * * * *